United States Patent
Roy et al.

(10) Patent No.: US 8,754,456 B2
(45) Date of Patent: Jun. 17, 2014

(54) MINIATURE IMAGE SENSOR

(75) Inventors: François Roy, Seyssins (FR); Arnaud Tournier, Grenoble (FR)

(73) Assignees: STMicroelectronics (Crolles 2) SAS, Crolles (FR); STMicroelectronics SA, Montrouge (FR)

( * ) Notice: Subject to any disclaimer, the term of this patent is extended or adjusted under 35 U.S.C. 154(b) by 651 days.

(21) Appl. No.: 12/534,344

(22) Filed: Aug. 3, 2009

(65) Prior Publication Data

US 2010/0032734 A1    Feb. 11, 2010

(30) Foreign Application Priority Data

Aug. 5, 2008    (FR) ...................................... 08 55410

(51) Int. Cl.
*H01L 31/036*    (2006.01)

(52) U.S. Cl.
USPC ..................... 257/292; 257/E2.133; 257/E31

(58) Field of Classification Search
USPC .................... 257/292, 446, E31.04, E27.133, 257/E27.132
See application file for complete search history.

(56) References Cited

U.S. PATENT DOCUMENTS

| | | | |
|---|---|---|---|
| 4,148,052 A | | 4/1979 | Nathanson et al. |
| 6,281,081 B1 * | | 8/2001 | Chien et al. .................. 438/296 |
| 6,821,826 B1 * | | 11/2004 | Chan et al. .................... 438/150 |
| 2006/0244020 A1 | | 11/2006 | Lee |
| 2007/0042519 A1 | | 2/2007 | Nomura et al. |
| 2007/0108371 A1 * | | 5/2007 | Stevens et al. ............. 250/214.1 |
| 2008/0017946 A1 * | | 1/2008 | Cazaux et al. ................ 257/447 |
| 2008/0173963 A1 * | | 7/2008 | Hsu et al. ...................... 257/431 |

OTHER PUBLICATIONS

French Search Report dated Apr. 6, 2009, from corresponding French Application No. 08/55410.
Raineri, V. et al. "Channeling Implants in Silicon Crystals." Materials Chemistry and Physics, Elsevier, vol. 38, No. 2, Jul. 1, 1994, pp. 105-130, XP024148117.
Yang, M. et al. "On the Integration of CMOS With Hybrid Crystal Orientations", VLSI Technology, 2004. Digest of Technical Papers. 2004 Symposium on Honolulu, HI, USA Jun. 15-17, 2004, Piscataway, NJ, USA,IEEE, Jun. 15, 2004.

* cited by examiner

*Primary Examiner* — Wensing Kuo
(74) *Attorney, Agent, or Firm* — Wolf, Greenfield & Sacks, P.C.

(57) ABSTRACT

An image sensor including at least one photodiode and at least one transistor formed in and on a silicon substrate, the assembly of the photodiode and of the transistor being surrounded with a heavily-doped insulating wall, wherein the silicon substrate has a crystal orientation (110).

13 Claims, 2 Drawing Sheets

MINIATURE IMAGE SENSOR

CROSS REFERENCE TO RELATED APPLICATIONS

This application claims the priority benefit of French patent application number 08/55410, filed on Aug. 5, 2008, entitled "MINIATURE IMAGE SENSOR," which is hereby incorporated by reference to the maximum extent allowable by law.

BACKGROUND OF THE INVENTION

1. Field of the Invention

The present disclosure relates to an image sensor of very small size. More specifically, the present invention relates to an image sensor in which the pixels are separated by deep insulating walls.

2. Discussion of the Related Art

FIG. 1 schematically illustrates an example of a circuit of a cell of an array of photosensitive cells of an image sensor. With each photosensitive cell of the array are associated a precharge device and a read device. The precharge device is formed of an N-channel MOS transistor $M_1$, interposed between a supply rail Vdd and a read node S. Precharge transistor gate $M_1$ is capable of receiving a precharge control signal RST. The read device is formed of the series connection of first and second N-channel MOS transistors $M_2$ and $M_3$. The drain of first read transistor $M_2$ is connected to supply rail Vdd. The source of second read transistor $M_3$ is connected to an input terminal P of a processing circuit (not shown). The gate of first read transistor $M_2$ is connected to read node S. The gate of second read transistor $M_3$ is capable of receiving a read signal RD. The photosensitive cell comprises a photodiode D having its anode connected to a source of a reference voltage GND, for example, the circuit ground, and having its cathode connected to node S via an N-channel charge transfer MOS transistor $M_4$. The gate of transfer transistor $M_4$ is capable of receiving a charge transfer control signal T. Generally, signals RD, RST, and T are provided by control circuits not shown in FIG. 1 and may be provided to all the photosensitive cells of a same row of the cell array. Node S plays the role of a charge storage region.

The operation of this circuit will now be described. A photodetection cycle starts with a precharge phase during which a reference voltage level is imposed at read node S. This precharge is performed by turning on precharge transistor $M_1$. Once the precharge has been performed, precharge transistor $M_1$ is turned off. The reference charge status at node S is then read. The cycle carries on with a transfer to node S of the photogenerated charges, that is, the charges created and stored, in the presence of a radiation, in photodiode D. This transfer is performed by turning on transfer transistor $M_4$. Once the transfer has been performed, transistor $M_4$ is off and photodiode D once again starts photogenerating and storing charges which will be subsequently transferred to node S. Simultaneously, at the end of the transfer, the new charge status at node S is read. The output signal transmitted to terminal P then depends on the pinch of the channel of first read transistor $M_2$, which is a direct function of the charge stored in the photodiode.

FIG. 2 shows a simplified top view of an image sensor and a conventional example of distribution of the electronic components (photodiodes and transistors) associated with the image sensor. The transistors and the photodiodes associated with the photosensitive cells are generally formed at the center of the image sensor at the level of block 11 (pixels). All around block 11 are formed the transistors of the peripheral transistors which, generally, carry out several processings of the signals associated with the photosensitive cells. As an example, blocks 13 (readout) correspond to the circuits dedicated to the provision of the control signals of the array of photosensitive cells and to the reading of the signals provided by the photosensitive cells. Generally, other peripheral circuits may be provided to perform additional functions directly at the level of the image sensor such as, for example, the correction of defects of the signals read from the read nodes of the photosensitive cells, the storage of images, signal processing operations, etc. Thus, block 15 (memory) may correspond to peripheral circuits dedicated to the storage of images. Blocks 17 (digital) may correspond to peripheral circuits dedicated to the performing of signal processing operations. Blocks 19 (IOs) may correspond to peripheral circuits dedicated to the processing of input/output interface signals and especially comprise transistors which are directly connected to the connection pads of the image sensor.

Usually, photosensitive cells forming image sensors are formed in and on a silicon substrate of crystal orientation (100). To avoid interference or crosstalk phenomena between pixels, insulating walls are formed between them. Several techniques are known to form such walls. For example, an upper portion of the substrate may be etched, and the obtained openings may be filled with an insulating material, for example, silicon oxide (STI technique).

Another technique comprises forming insulating walls in the form of heavily-doped regions. For example, if the substrate is of type P, heavily-doped P-type walls are formed around the pixel elements. Thus, the electrons of electron/hole pairs created close to these walls are pushed back towards the capture area of the photodiode and are not captured by a neighboring photodiode.

Such insulating walls are generally formed by implantation of dopant atoms from the substrate surface. The implantation system is placed along a direction forming a non-zero angle with the direction perpendicular to the substrate surface, generally ranging between 6 and 8°. This enables to become independent from possible variations of the implantation angle of the implantation systems, such variations being currently approximately 1°. Indeed, when the angle varies by 1° around an angle of approximately 7°, the implantation depth varies little for a same implantation power.

If the implantation direction approaches the direction perpendicular to the substrate surface, the implantation depth may vary significantly. This can be explained by the crystal structure of the substrate: the atoms of a silicon substrate of crystal orientation (100) form, in the direction perpendicular to the substrate surface, channels in which dopant atoms penetrate more easily than in slightly oblique directions. This effect is called "channeling".

The current tendency to decrease the size of electronic and opto-electronic components has led designers to form circuits comprising elements having lateral dimensions, in the plane of the substrate surface, which are increasingly small. This decrease generally goes along with a decrease in the depth of the elements, perpendicularly to the substrate surface. In the case of image sensors, the lateral dimensions are desired to be decreased, but a relatively large depth should be maintained, typically from 2 to 3 µm for image sensors intended to receive light rays in the visible spectrum. Indeed, when silicon is illuminated, the absorption depth of the photons depends on the wavelength of the light rays. For example, for red light rays, the absorption depth of photons is on the order of from 3 µm to 5 µm. Thus, the width of the pixels and of the insulating walls is desired to be decreased while maintaining deep walls to properly separate absorption areas corresponding to different pixels and limit the crosstalk.

Currently, to form insulating walls having a depth of approximately 3 µm, implantations of dopants at high powers, for example, ranging between 500 and 1,000 keV, are performed. To perform such implantations, it is necessary to form a resin mask of significant thickness in front of the substrate. Typically, for insulating walls having a 3-µm depth, the resin mask has a thickness ranging between 2 and 2.5 µm. The significant thickness of the resin mask does not enable forming, therein, openings of small size. Thus, the use of such a mask limits the width of the insulating walls which may be formed. Further, since the dopant implantations are performed in a direction forming a non-zero angle with the direction perpendicular to the substrate, the thick mask tends to hinder and to limit the implantation (shadowing effect). Thus, with current techniques, the width of the insulating walls cannot be smaller than approximately 0.7 µm for a depth of approximately 3 µm.

Pixels having lateral dimensions on the order of 1.4 µm when the insulating walls have a 0.7-µm depth are currently formed. The remaining surface for each active area of the pixels then only amounts to one quarter of the total surface area of the pixels. If the lateral dimensions of the pixels are decreased without modifying the width of the insulating walls, this proportion is further decreased.

Thus, current techniques do not enable to design image sensors formed of pixels of small size in which the insulating walls have a very large shape factor (a depth of more than 2 µm for a width of less than 0.7 µm).

SUMMARY OF THE INVENTION

An object of embodiments of the present invention aims at a silicon substrate in which insulating walls with a large shape factor are formed.

Another object of embodiments of the present invention aims at an image sensor comprising pixels of decreased lateral dimensions and comprising insulating walls with a large shape factor.

Thus, an embodiment of the present invention provides an image sensor comprising at least one photodiode and at least one transistor formed in and on a silicon substrate, the assembly of the photodiode and of the transistor being surrounded with a heavily-doped insulating wall, the silicon substrate having a crystal orientation (110).

According to an embodiment of the present invention, the insulating wall has a depth greater than 2 µm and a width smaller than 0.5 µm.

According to an embodiment of the present invention, the insulating wall is formed by a dopant implantation along a direction perpendicular to the silicon substrate surface.

According to an embodiment of the present invention, the implantation is performed with an implantation power smaller than 300 keV.

According to an embodiment of the present invention, the substrate of orientation (110) and the insulating wall are N-type doped and the transistor is a PMOS transistor.

According to an embodiment of the present invention, the insulating wall is doped with phosphorus, arsenic, or antimony atoms.

According to an embodiment of the present invention, the insulating wall is doped with phosphorus atoms.

According to an embodiment of the present invention, the image sensor further comprises a substrate of crystal orientation (100) which extends above the substrate of crystal orientation (110) and wherein transistors with a large switching speed are formed.

According to an embodiment of the present invention, the photodiode is illuminated from the rear surface of the substrate of crystal orientation (110).

The foregoing objects, features, and advantages of the present invention will be discussed in detail in the following non-limiting description of specific embodiments in connection with the accompanying drawings.

DETAILED DESCRIPTION

Figure 1:
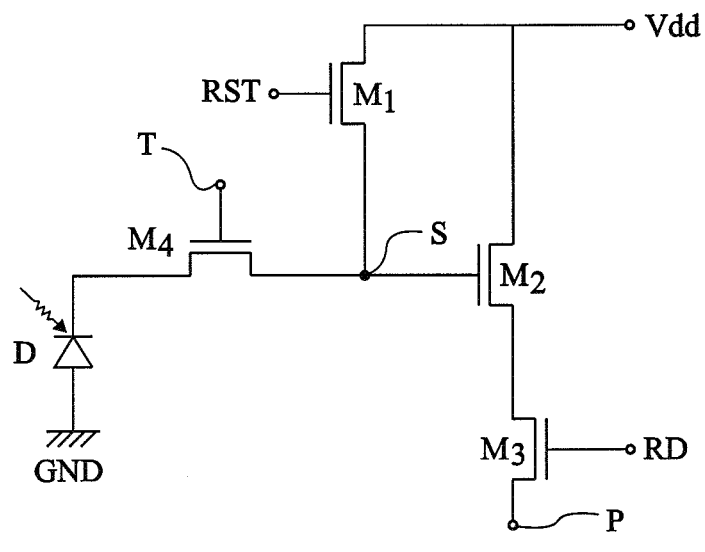
FIG. 1, previously described, shows an electric diagram of a photosensitive cell.

For clarity, the same elements have been designated with the same reference numerals in the different drawings and, moreover, as usual in the representation of integrated circuits, the various drawings are not to scale.

To form insulating walls having widths smaller than 0.7 µm for depths greater than 2 µm, the present inventors provide, rather than trying to avoid channeling phenomena, to take advantage thereof by performing implantations along a direction substantially perpendicular to the substrate surface. To increase channeling phenomena, the present inventors provide forming image sensors, or at least the photodiodes of image sensors, no longer in a substrate of crystal orientation (100) but in a substrate of orientation (110). Indeed, the atoms of a substrate of crystal orientation (110) form channels, in the direction perpendicular to the substrate surface, which are wider than those present in a substrate of crystal orientation (100). The presence of such wider channels avoids the accuracy problems (to within 1° approximately) of dopant implantation systems, and takes advantage of channeling effects for substantially all implanted dopants, the channeling being more significant when the dopant atoms are small/light.

Thus, dopants can be deeply implanted with low implantation powers, typically lower than 500 keV, and insulating walls having a depth on the order of from 2 to 3 µm for a width ranging between 0.2 and 0.5 µm in a substrate of orientation (110) are formed. An implantation perpendicular to the substrate surface enables avoiding resin shadowing effects. Further, the low-power implantation enables to use resin masks of decreased thicknesses, on the order of 1 µm. As an example, the power required to form walls having depths of approximately 2 µm with a substrate of crystal orientation (110) is on the order of from 20 to 200 keV. It should be noted that the implantation power depends on the type of atoms which are implanted and, more specifically, on their size. Indeed, the larger an atom, the less it penetrates into the crystal lattice. Thus, for type P, boron (atomic number 5) is implanted deeper than indium (atomic number 49) with a same implantation power. For type N, arsenic (atomic number 33) is implanted at a smaller depth than phosphorus (atomic number 15) and a larger depth than antimony (atomic number 50) with a same implantation power.

Given these implantation constraints, only boron implantations could be envisaged in (100) substrates to form insulating walls with a large shape factor. (110) substrates thus enable to form photodiodes, transistors, and thus pixels of inverted type (PMOS in an N-type substrate) with narrow and deep N-type insulating walls. Indeed, a phosphorus implantation (atomic number 15) becomes reasonably possible, while, conventionally, deep implantations could only reasonably be performed with light atoms/ions such as boron (atomic number 5).

Figure 3:
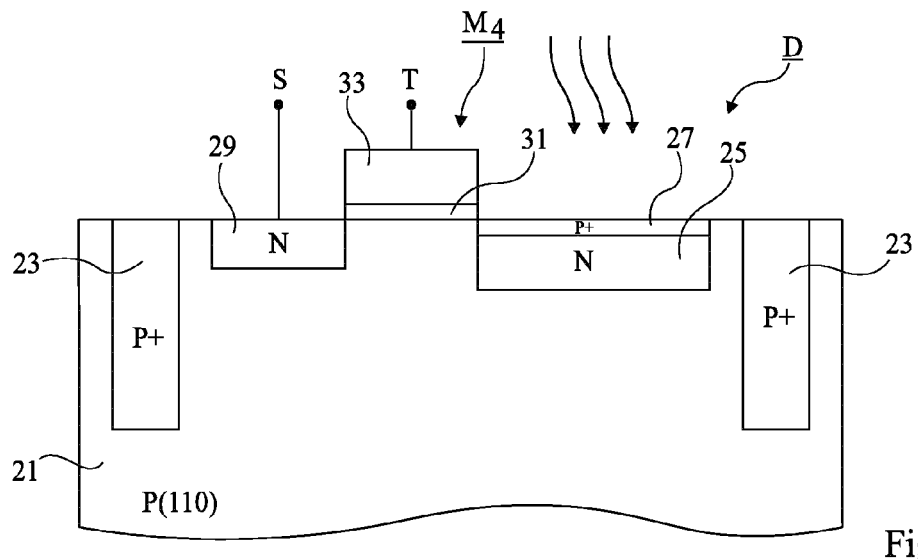
FIG. 3 is a partial cross-section view of an example of an image sensor according to an embodiment of the present invention.

FIG. 3 illustrates a partial view of an example of an image sensor structure. In this drawing, photodiode D and transistor $M_4$ of a cell of an image sensor have been shown (FIG. 1). The cell is formed in and on a P-type substrate 21 of crystal orientation (110). In the shown example, photodiode D and transistor $M_4$ are delimited by an insulating wall 23 formed of a heavily-doped P-type region ($P^+$) which extends in substrate 21. Photodiode D comprises an N-type region 25 formed in substrate 21. In the case where photodiodes of fully depleted type are used, region 25 is covered with a P-type region 27, more heavily doped than substrate 21. An N-type region 29, formed in substrate 21, corresponds to the drain region of transistor $M_4$. An insulating portion 31 extends on the upper surface of substrate 21, between regions 27 and 29, and corresponds to the gate oxide of transistor $M_4$. Insulating portion 31 is covered with a polysilicon portion 33 corresponding to the gate of transistor $M_4$. Spacers (not shown) may be formed on either side of the gate of transistor $M_4$.

It may also be provided to form, in the depth of substrate 21, heavily-doped P-type deep insulation barriers, under the photon absorption area. These barriers may also be formed by taking advantage of the channeling effects of the substrate of crystal orientation (110) and be formed at a significant depth in the substrate.

Figure 4:
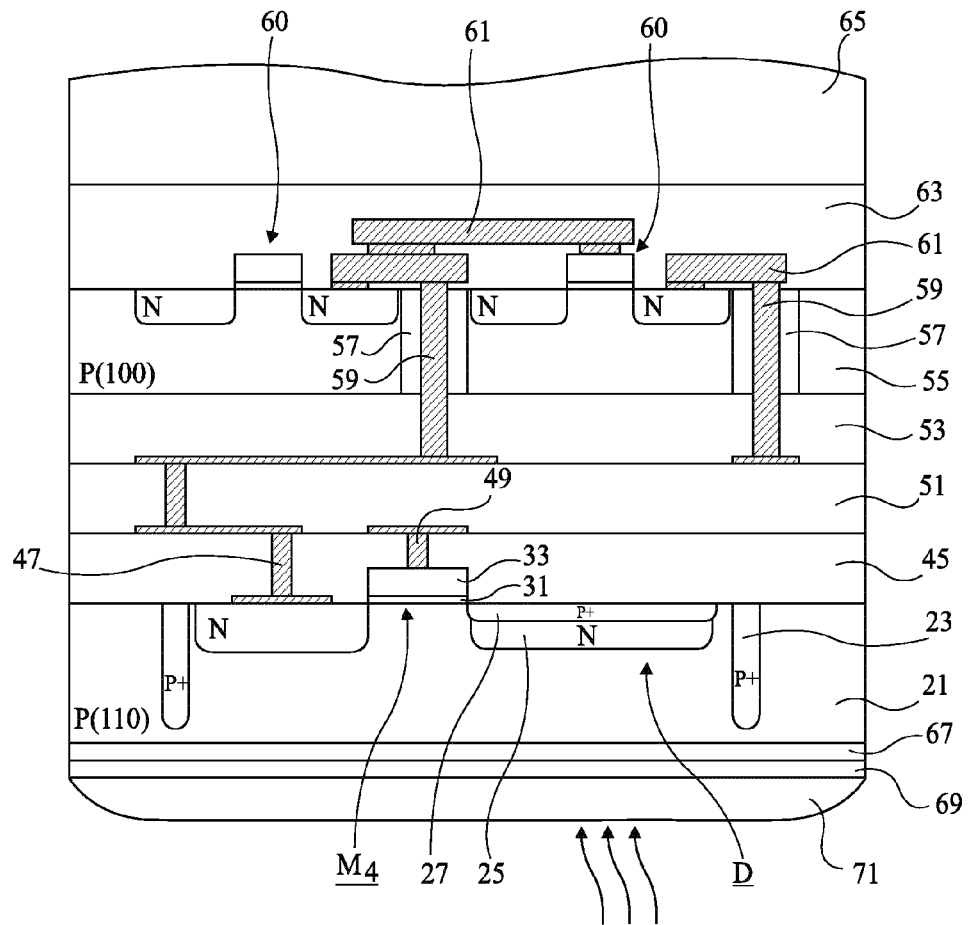
FIG. 4 illustrates another embodiment of an image sensor according to an embodiment of the present invention.

FIG. 4 illustrates an embodiment of a pixel of a back-lit image sensor. This means that the light rays reach the substrate from its surface opposite to that where the transistors of the photosensitive cell are formed.

In the example of FIG. 4, P-type doped substrate 21 is of crystal orientation (110). Elements identical to those of FIG. 3 are formed on and inside of this substrate. An insulating layer 45 in which extend metal regions which enable to connect the elements formed on and in substrate 21 to one another and to other elements (first interconnection level) is formed on the upper surface of substrate 21, on the side of transistor $M_4$. In the shown example, a metal via 47 is taken on the drain of transistor $M_4$ and a metal via 49 is taken on the gate of transistor $M_4$. A stacking 51, 53 of insulating layers in which are formed different interconnect levels extends above insulating layer 45. In the drawing, only a few metal connection elements (conductive tracks and vias) are shown.

On top of insulating stacking 51, 53 extends a second P-type doped silicon substrate 55 of crystal orientation (100). In this substrate are formed through insulating regions 57 in which conductive vias 59 are formed. Transistors 60 having certain portions connected in adapted manner to vias 59 by metal tracks 61 are formed on and inside of second substrate 55. Metal tracks 61 are formed in an insulating layer 63 which extends on transistors 60. A support 65 of a material enabling to rigidify the entire structure is formed on top of insulating layer 63. On a low surface of first substrate 21 is formed a thin heavily-doped P-type layer 67 and, under this layer, a color filter 69 and a lens 71. Lens 71 focuses the light rays reaching the lower surface of substrate 21 towards photodiode D.

Figure 2:
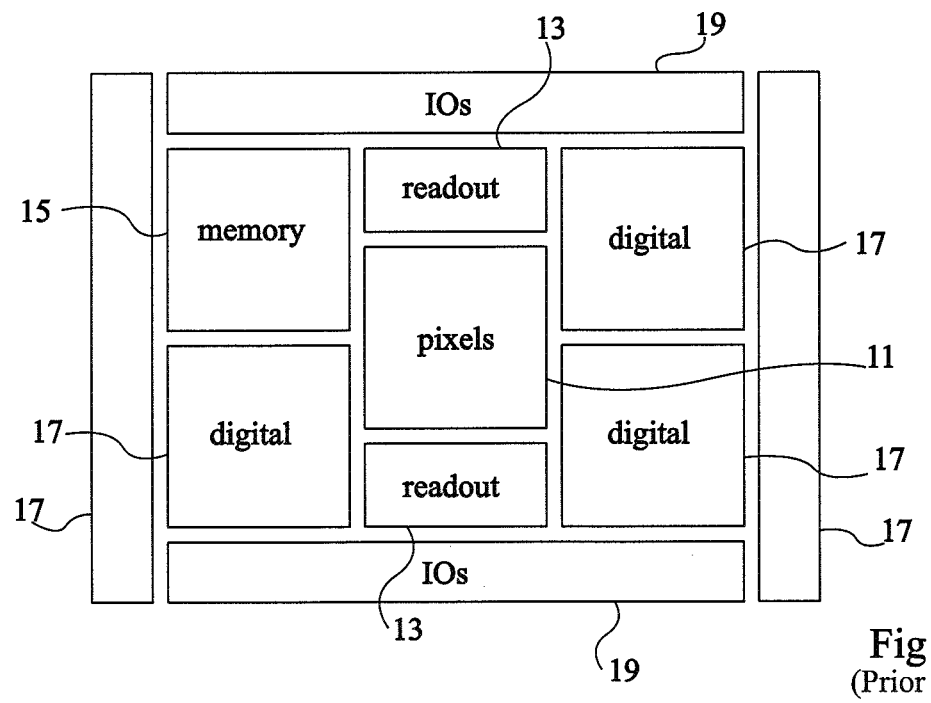
FIG. 2, previously described, shows an example of distribution of the components of an image sensor.

Thus, a structure in which image capture element (photodiode and read transistors) are formed in a first substrate of orientation (110), and in which transistors 60 are formed in a substrate of orientation (100) is obtained. Transistors 60 are, for example, transistors of memory block 15 of FIG. 2 or signal processing transistors (block 17, FIG. 2) which should switch very fast (at frequencies greater than one megahertz). The forming of such transistors in second substrate 55 of orientation (100) enables them to have high switching speeds. The forming of the image capture elements in substrate 21 of orientation (110) enables forming insulating walls having a large shape factor, and thus to form image sensors having pixels of very small dimensions. The transistors directly associated with the photodiodes, for example, transistors $M_1$, $M_2$, $M_3$, and $M_4$, generally operate at frequencies smaller than one megahertz. That they be formed in a substrate of crystal orientation (110) which slightly slows them with respect to substrates of orientation (100) thus matters little. Thus, the advantages of a substrate of orientation (110) and of a substrate of orientation (100) are cumulated.

FIG. 4 is a variation of an assembly described in European patent application No 1883112 of the applicant (B7731) which uses the method described herein. Many other modes of assembly of two silicon substrates may be used.

Specific embodiments of the present invention have been described. Various alterations and modifications will occur to those skilled in the art. In particular, it should be understood that the examples of FIGS. 3 and 4 are not limiting and that the use of a substrate of orientation (110) to form insulating walls with a large shape factor may be applied to other devices.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An image sensor comprising at least one photodiode and at least one transistor formed in and on a silicon substrate, the assembly of the photodiode and of the transistor being surrounded with a heavily-doped, ion implanted insulating wall, the insulating wall formed by dopant ion implantation into the substrate, wherein the silicon substrate has a crystal orientation (110), wherein the insulating wall has a depth of 2 to 3 micrometers and a width between 0.2 and 0.5 micrometer.

2. The image sensor of claim 1, wherein the insulating wall is formed by a dopant implantation along a direction perpendicular to the silicon substrate surface.

3. The image sensor of claim 2, wherein the implantation is performed with an implantation power smaller than 300 keV.

4. The image sensor of claim 1, wherein the substrate of orientation (110) and the insulating wall are N-type doped and wherein the transistor is a PMOS transistor.

5. The image sensor of claim 4, wherein the insulating wall is doped with phosphorus, arsenic, or antimony.

6. The image sensor of claim 4, wherein the insulating wall is doped with phosphorus.

7. The image sensor of claim 1, further comprising a substrate of crystal orientation (100) which extends above the substrate of crystal orientation (110) and wherein transistors with a high switching speed are formed.

8. The image sensor of claim 7, wherein the photodiode is illuminated from the rear surface of the substrate of crystal orientation (110).

9. An image sensor comprising:
a substrate;
a photodiode and a transistor formed in the substrate; and
an ion implanted insulating wall formed by dopant ion implantation into the substrate and surrounding the photodiode and the transistor, the substrate being silicon having a crystal orientation (110), wherein the insulating wall has a depth of 2 to 3 micrometers and a width between 0.2 and 0.5 micrometer.

10. An image sensor as defined in claim 9, wherein the insulating wall is formed by dopant implantation along a direction perpendicular to a surface of the substrate.

11. An image sensor as defined in claim 9, wherein the substrate and the insulating wall are N-type doped and wherein the transistor is a PMOS transistor.

12. A method for fabrication of an image sensor, comprising:
   providing a silicon substrate having a crystal orientation (110);
   forming a photodiode and a transistor in the silicon substrate; and
   implanting a heavily-doped insulating wall in the silicon substrate and surrounding the photodiode and the transistor, wherein the insulating wall has a depth of 2 to 3 micrometers and a width between 0.2 and 0.5 micrometer.

13. A method as defined in claim 12, wherein implanting the insulating wall is performed by dopant implantation along a direction perpendicular to a surface of the silicon substrate.

* * * * *